USO06601125B1

(12) United States Patent
Campbell

(10) Patent No.: US 6,601,125 B1
(45) Date of Patent: Jul. 29, 2003

(54) MINIMIZING SIGNAL STUB LENGTH FOR HIGH SPEED BUSSES

(75) Inventor: Robert G Campbell, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/528,757

(22) Filed: Mar. 17, 2000

(51) Int. Cl.[7] ............ G06F 13/14; H05K 7/10; H01R 9/00; H01L 23/48; H01L 23/52; H01L 29/40
(52) U.S. Cl. ............ 710/305; 361/760; 361/767; 361/772; 257/697; 257/780; 257/784
(58) Field of Search ............ 710/305; 174/52.1; 361/761, 764, 767, 772–775; 257/678, 784, 780, 779, 738, 697, 691; 333/12

(56) References Cited

U.S. PATENT DOCUMENTS

| 5,266,833 A | * | 11/1993 | Capps ............ 257/690 |
| 5,982,632 A | * | 11/1999 | Mosley et al. ............ 174/261 |
| 6,008,534 A | * | 12/1999 | Fulcher ............ 257/691 |
| 6,064,113 A | * | 5/2000 | Kirkman ............ 257/691 |
| 6,091,140 A | * | 7/2000 | Toh et al. ............ 257/691 |
| 6,153,829 A | * | 11/2000 | Carapella et al. ............ 257/345 |
| 6,198,635 B1 | * | 3/2001 | Shenoy et al. ............ 361/760 |

OTHER PUBLICATIONS

Pub. No. :US 2002/0033276 A1□□Dabral et al.□□Inline and "Y" Input–Output Bus Topology.*
Pub. No. :US 2002/0033276 A1, Dabral et al., Inline and "Y" Input–Output Bus Topology.*

* cited by examiner

Primary Examiner—Rupal Dharia
Assistant Examiner—Trisha Vu

(57) ABSTRACT

An integrated circuit package for electrically interconnecting a first bus signal path disposed on a printed circuit board and a second bus signal path disposed on the printed circuit board. The integrated circuit package may have a substrate, an integrated circuit chip die supported by the substrate. The interconnection network may be for electrically connecting the first bus signal path and the second bus signal path to a chip pad on the chip die. Thus, the first bus signal path and the second bus signal path may be electrically interconnected by only the interconnection circuit.

10 Claims, 3 Drawing Sheets

MINIMIZING SIGNAL STUB LENGTH FOR HIGH SPEED BUSSES

BACKGROUND OF THE INVENTION

The disclosed invention generally relates to digital computer bus systems, and more particularly to a bus conductor structure that significantly reduces signal stub length.

A digital computer system employs a multi-drop computer bus to communicate information between different components of the computer system. A computer bus is essentially a set of generally parallel electrically conductive signal lines or paths that communicate digital signals amongst different components of the computer system, and is commonly implemented as a plurality of generally parallel conductive traces supported by a printed circuit board.

FIG. 1 sets forth a schematic block diagram of a computer system that includes a main computer bus 11 and a secondary computer bus 12. The main computer bus 11 is used, for example, for time critical functions such as high speed memory access, and connects a processor 13 to memory 14 and to various I/O interfaces 15 that in turn are connected to various I/O devices such as displays, keyboards, etc. The secondary computer bus 12 operates a slower speed than the primary computer bus 11, and is used to accommodate slower I/O interfaces 16. A bus controller 18 can be employed to couple the main computer bus 11 to the secondary bus 12.

Each of the components connected to a multi-drop computer bus are implemented as one or more integrated circuits, wherein each integrated circuit is comprised of an integrated circuit package that houses an integrated circuit die and includes external electrical contacts on the outside of the package that are electrically connected to the integrated circuit die by conductive signal lines in the substrate of the package and wire bonds within the package. The external contacts are electrically coupled to respective computer bus signal lines by respective conductive lines formed in the circuit board that supports the computer bus. Thus, a wire bond, a package substrate based conductive line and a printed circuit board conductive line form a stub line that is a conductive signal path between a contact on an IC die and a computer bus signal path.

Signal transitions on a stub line cause reflections on the bus signal line to which it is connected, and as the operating frequency of a computer bus increases, reflections cause degradation of the signals on the computer bus lines. In other words, with increased operating frequency, reflections detrimentally impact the quality and integrity of signals on the computer bus.

There is accordingly a need for reducing reflections on a computer bus that are caused by connections to the bus.

SUMMARY OF THE INVENTION

The disclosed invention is directed to a computer bus that includes a conductive signal path comprised of a first conductive signal path in a printed circuit board, and a second conductive signal path in an integrated circuit package and electrically connected to said first conductive signal path, a third conductive signal path in the integrated circuit package, a fourth conductive signal path in the printed circuit board and electrically connected to said third conductive signal path, and circuitry electrically in the package electrically connecting said second conductive signal path and said third conductive signal path to a contact of an integrated circuit chip die contained in the integrated circuit package.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
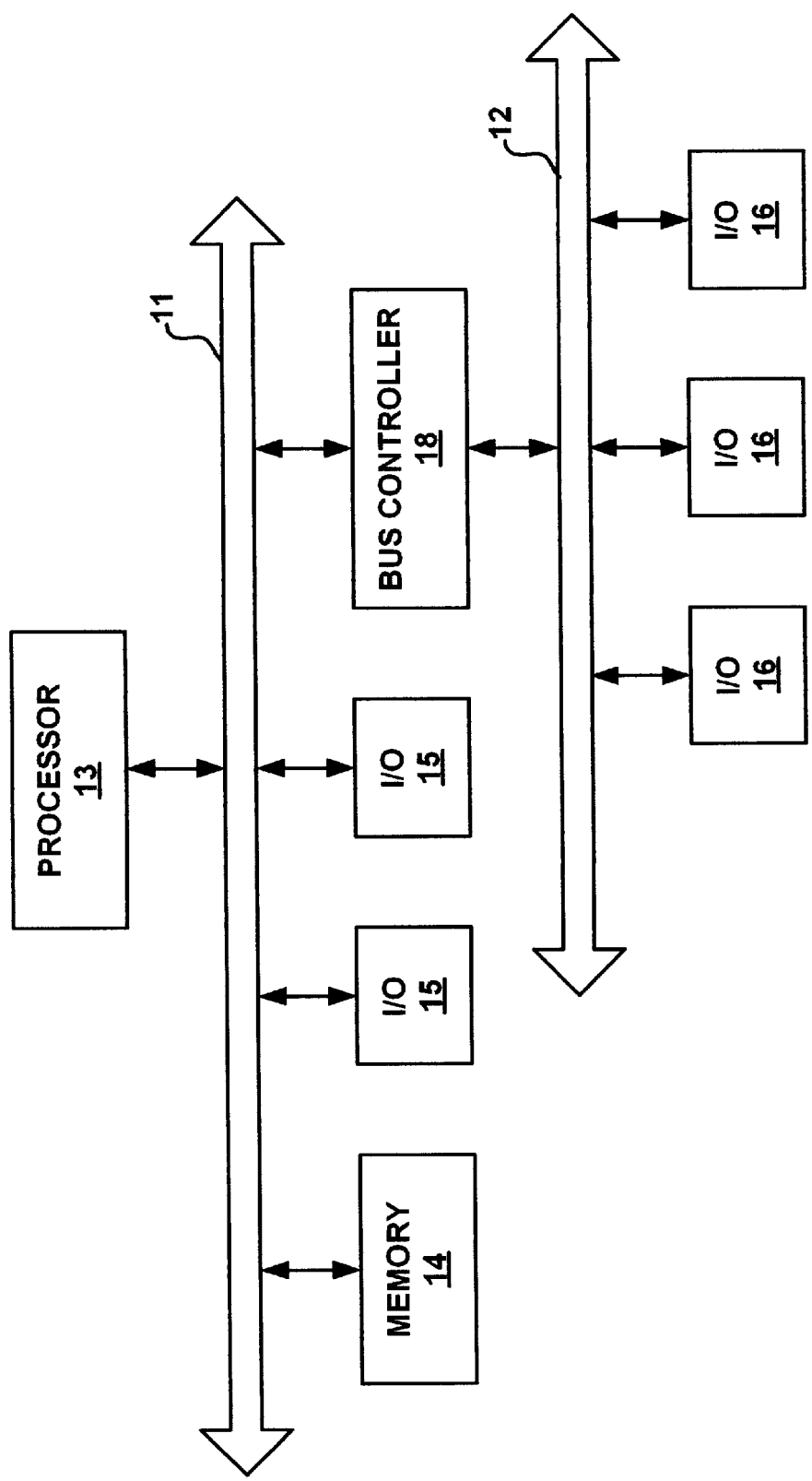
FIG. 1 is a block diagram of computer system that employs a computer busses to communicate information between different parts of the computer system

In the following detailed description and in the several figures of the drawing, like elements are identified with like reference numerals.

Figure 2:
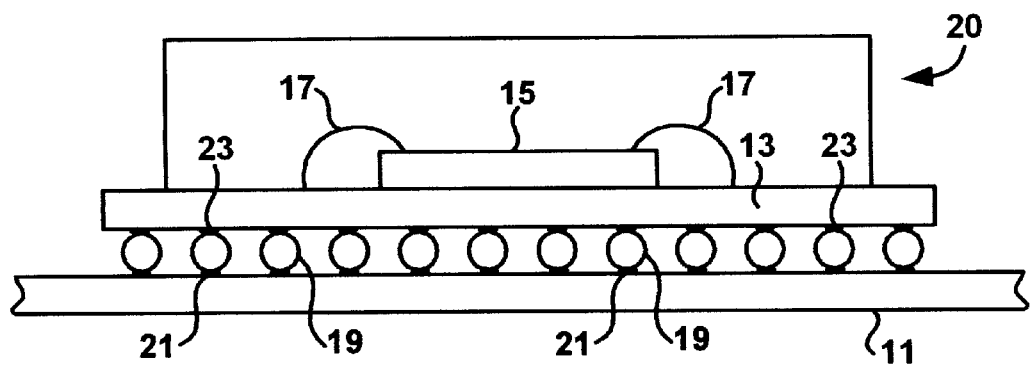
FIG. 2 is a schematic elevational view of a circuit structure that incorporates a computer bus interconnect circuit in accordance with the invention.

Referring now to FIG. 2, set forth therein is a schematic elevational diagram of a circuit structure 10 that incorporates a computer bus circuit in accordance with the invention. The circuit structure includes a printed circuit board 11 and a ball grid array integrated circuit (IC) package 20 that includes an integrated circuit chip die 15 supported by a package substrate 13. The chip die 15 is electrically interconnected to conductive lines in the package substrate 13 by wire bonds 17, while the package substrate 13 is electrically interconnected to and secured to the printed circuit board 11 by a number of solder balls 19 that are conventionally adhered between conductive pads 21 on the top surface of the printed circuit board 11 and conductive pads 23 on the lower surface of the package substrate 13.

The package substrate 13 employs an interconnect circuit in accordance with the invention that significantly reduces the line length of a stub line connected to a line of a computer bus. As a result, reflections on the computer bus are significantly reduced. In accordance with a specific aspect of the invention, a stub line is completely contained within the integrated circuit package 20.

Figure 3:
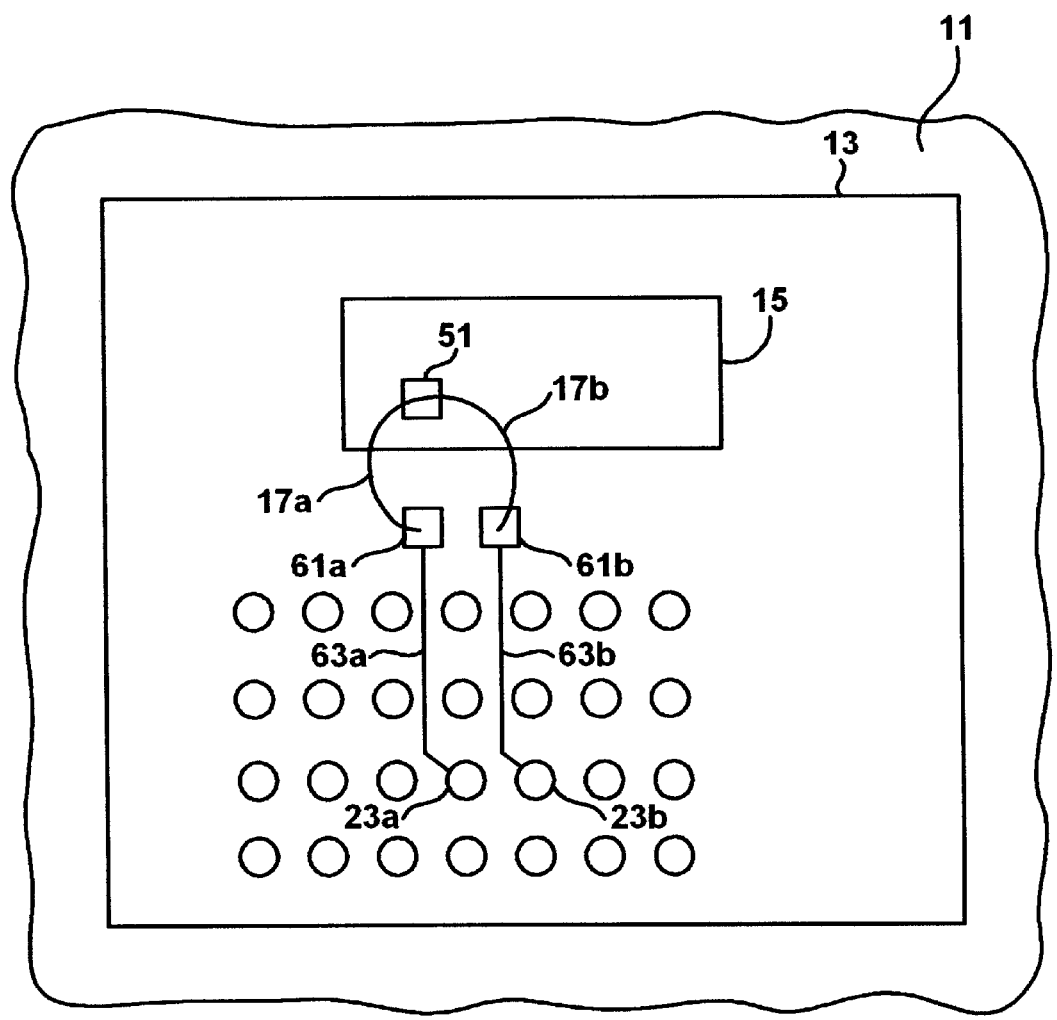
FIG. 3 is a schematic top plan view of the integrated circuit package of the circuit structure of FIG. 2.

Referring now to FIG. 3, set forth therein is a schematic top plan view illustrating an interconnect circuit in accordance with the invention as employed in the package substrate 13 and the integrated circuit chip die 15. A first wire bond 17a is connected between a chip pad 51 on the chip die 15 and a bond pad 61a on the package substrate 13. The first bond pad 61a is electrically connected to a first metal pad 23a on the bottom of the package 13 by a conductive line 63a formed in the substrate 13. A second wire bond 17b is connected between the chip pad 51 and a second bond pad 61b on the package substrate 13. The second bond pad 61b is electrically connected to a second metal pad 23b on the bottom of the package 13 by an electrically conductive line 63b. Each of the substrate based electrically conductive lines 63a, 63b comprises for example conductive traces and/or conductive vias formed in the package substrate 13.

Figure 4:
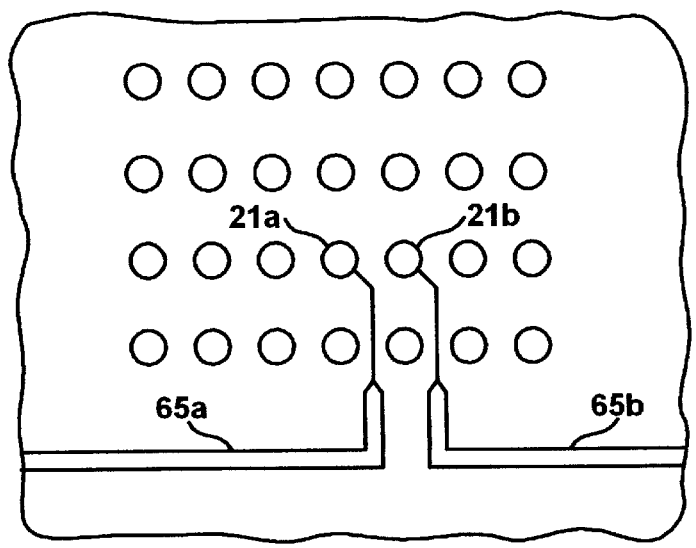
FIG. 4 is a schematic top plan view of the printed circuit board of the circuit structure of FIG. 2.

Referring now to FIG. 4, set forth therein is a schematic top plan view of electrically conductive lines 65a, 65b disposed in the printed circuit board 11 that cooperatively form with conductive elements in the IC package 20 a bus signal line. More particularly, an electrically conductive line 65a and a conductive line 65b formed in the printed circuit board 11 are connected to respective first and second pads 21a, 21b on the printed circuit board 11. Each of electrically conductive lines 65a, 65b is conventionally comprised of conductive circuit elements such as conductive traces and/or conductive vias. The first and second pads 21a, 21b on the printed circuit board 11 are respectively electrically connected to the first and second pads 23a, 23b on the lower surface of the package substrate 13 by appropriate solder balls 19 (FIG. 2).

In this manner, a computer bus line signal path is formed by the printed circuit board based conductive line 65a, the package substrate based conductive line 63a, the wire bond 17a, the wire bond 17b, the package substrate based conductive line 63b, the printed circuit board based conductive line 65b, and the interconnecting pads and solder balls. Such computer bus line signal path thus passes through the integrated circuit chip die 15, as well as through the integrated circuit package. Since the computer bus signal path passes through a chip pad on the chip die, the stub line length is virtually zero. This is in contrast to a conventional stub line that would extend between the chip pad 51 and a computer bus signal path disposed only on the printed circuit board.

Figure 5:
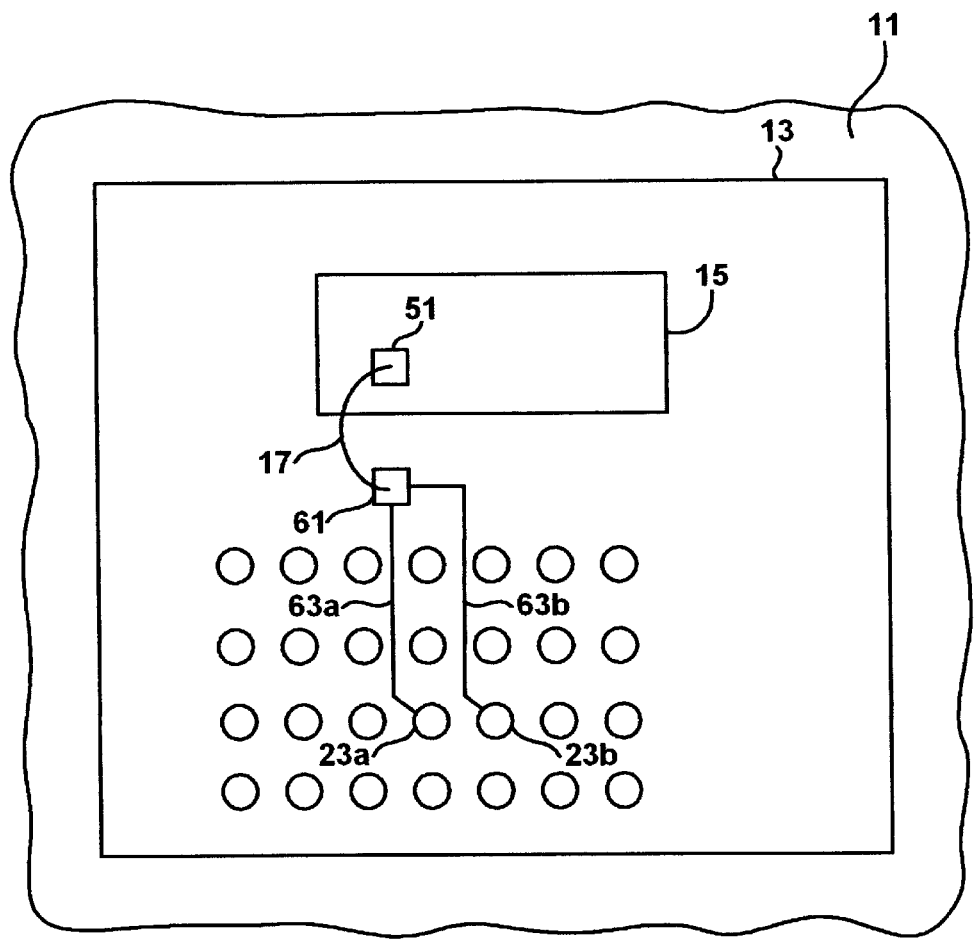
FIG. 5 is a schematic top plan view of a further integrated circuit package of the circuit structure of FIG. 2.

Referring now to FIG. 5, set forth therein is a top plan view of a further interconnect circuit in accordance with the invention as employed in the package substrate 13 and the integrated circuit chip die 15. A wire bond 17 is connected between a chip pad 51 on the chip die 15 and a bond pad 61 on the package substrate 13. The bond pad 61 is electrically connected to a first metal pad 23a on the bottom of the package substrate 13 by a conductive line 63a formed in the substrate 13. The bond pad 61 is further electrically connected to a second metal pad 23b on the bottom of the package substrate 13 by an electrically conductive line 63b. Each of the substrate based electrically conductive lines 63a, 63b comprises for example conductive traces and/or conductive vias formed in the package substrate 13.

The interconnect circuit of FIG. 5 allows for a stub line length that is effectively the length of the bond wire 17.

The foregoing has thus been a disclosure of a computer bus interconnect circuit that advantageously allows for reduced stub line length by routing a bus signal path through an integrated circuit package.

Although the foregoing has been a description and illustration of specific embodiments of the invention, various modifications and changes thereto can be made by persons skilled in the art without departing from the scope and spirit of the invention as defined by the following claims.

What is claimed is:

1. A computer bus comprising:
   an integrated circuit package having a package substrate and an integrated circuit chip die disposed on said package substrate;
   a first signal path in said integrated circuit package extending between a first bond pad in said integrated circuit package and a first external contact of said integrated circuit package;
   a second signal path in said integrated circuit package extending between a second bond pad in said integrated circuit package and a second external contact of said integrated circuit package;
   an electrical circuit for electrically connecting the first bond pad and the second bond pad to a chip pad on the chip die;
   a third signal path external of said integrated circuit package having one end electrically connected to said first external contact; and
   a fourth signal path external of said integrated circuit package having one end electrically connected to said second external contact;
   wherein said third signal path is electrically connected to said fourth signal path exclusively by said first signal path, said second signal path and said electrical circuit.

2. The computer bus of claim 1 wherein said electrical circuit comprises a first wire bond connected between the first bond pad and the chip pad, and a second wire bond connected between the second bond pad and the chip pad.

3. The computer bus of claim 1 wherein said third signal path and said fourth signal path are disposed in a printed circuit board.

4. A computer bus comprising:
   an integrated circuit package having a package substrate and an integrated circuit chip die disposed on said package substrate;
   a first signal path in said integrated circuit package extending between a bond pad in said integrated circuit package and a first external contact of said integrated circuit package;
   a second signal path in said integrated circuit package extending between the bond pad in said integrated circuit package and a second external contact of said integrated circuit package;
   an electrical circuit for electrically connecting the bond pad to a chip pad on the chip die;
   a third signal path external of said integrated circuit package having one end electrically connected to said first external contact; and
   a fourth signal path external of said integrated circuit package having one end electrically connected to said second external contact;
   wherein said third signal path is electrically connected to said fourth signal path exclusively by said first signal path, said second signal path and said bond pad.

5. The computer bus of claim 4 wherein said electrical circuit comprises a wire bond connected between the bond pad and the chip pad.

6. The computer bus of claim 4 wherein said third signal path and said fourth signal path are disposed in a printed circuit board.

7. An integrated circuit package for electrically interconnecting a first bus signal path disposed on a printed circuit board and a second bus signal path disposed on the printed circuit board, the integrated circuit package comprising:
   a substrate;
   an integrated circuit chip die supported by said substrate; and
   an interconnection network supported by said substrate for electrically connecting the first bus signal path and the second bus signal path to a chip pad on said chip die, wherein the first bus signal path and the second bus signal path are electrically interconnected only by said interconnection network.

8. The integrated circuit package of claim 7 wherein said interconnection network includes a first external contact and a second external contact respectively connected to said first bus signal path and said second bus signal path, and an electrical network for electrically connecting said first and second external contacts to the chip pad.

9. The integrated circuit package of claim 8 wherein said electrical network comprises:
   a first signal path between said first external contact and a first bond pad;

a second signal path between said second external contact and a second bond pad;

a first wire bond connected between the first bond pad and said chip die; and a second wire bond connected between the second bond pad and said chip die.

10. The integrated circuit package of claim 8 wherein said electrical network comprises:

a first signal path between said first external contact and a bond pad;

a second signal path between said second external contact and the bond pad; and a wire bond connected between the bond pad and said chip die.

\* \* \* \* \*